United States Patent
Azdasht

(10) Patent No.: US 9,685,423 B2
(45) Date of Patent: Jun. 20, 2017

(54) SEMICONDUCTOR CHIP ASSEMBLY AND METHOD FOR MANUFACTURING THE SAME

(71) Applicant: Pac Tech—Packaging Technologies GmbH, Nauen (DE)

(72) Inventor: Ghassem Azdasht, Berlin (DE)

(73) Assignee: PAC TECH—PACKAGING TECHNOLOGIES GMBH, Nauen (DE)

( * ) Notice: Subject to any disclaimer, the term of this patent is extended or adjusted under 35 U.S.C. 154(b) by 0 days.

(21) Appl. No.: 14/763,898

(22) PCT Filed: Jan. 22, 2014

(86) PCT No.: PCT/EP2014/051194
§ 371 (c)(1),
(2) Date: Jul. 28, 2015

(87) PCT Pub. No.: WO2014/118044
PCT Pub. Date: Aug. 7, 2014

(65) Prior Publication Data
US 2015/0364446 A1 Dec. 17, 2015

(30) Foreign Application Priority Data
Jan. 31, 2013 (DE) .......... 10 2013 001 642

(51) Int. Cl.
*H01L 25/065* (2006.01)
*H01L 25/00* (2006.01)
(Continued)

(52) U.S. Cl.
CPC ........ *H01L 25/0655* (2013.01); *B23K 1/0016* (2013.01); *B23K 1/0056* (2013.01);
(Continued)

(58) Field of Classification Search
CPC ............ H01L 25/0652; H01L 25/0655; H01L 25/112; H01L 25/115; H01L 2225/06555; H01L 25/0657
See application file for complete search history.

(56) References Cited

U.S. PATENT DOCUMENTS 4,266,282 A * 5/1981 Henle ............... H01L 23/5387
257/E21.511
5,113,314 A * 5/1992 Wheeler ............ H01L 23/467
257/E23.099
(Continued)

FOREIGN PATENT DOCUMENTS

JP 62 293750 12/1987
KR 2011 0107125 9/2011
(Continued)

OTHER PUBLICATIONS

PCT English Language Translation of the International Preliminary Report on Patentability, PCT/EP2014/051194, Aug. 13, 2015, 11 pages.
(Continued)

*Primary Examiner* — Mark Tornow
*Assistant Examiner* — Abbigale Boyle
(74) *Attorney, Agent, or Firm* — Quarles & Brady LLP

(57) ABSTRACT

The invention relates to a chip arrangement (18) comprising a terminal substrate (12) and a plurality of semiconductor substrates (1) which are arranged on the terminal substrate, in particular chips, wherein terminal faces (5) arranged on a contact surface of the chips (1) are connected to terminal faces on a contact surface (14) of the terminal substrate (12), wherein the chips (1) extend parallel with a lateral edge and transversally with their contact surface to the contact surface of the terminal substrate (12), wherein vias (13) are arranged in the terminal substrate, which connect external contacts (15) arranged on an external contact side to terminal faces
(Continued)

formed as internal contacts (14) on the contact surface of the terminal substrate, wherein terminal faces of the chips, which are arranged adjacent to the lateral edge, are connected to the internal contacts of the terminal substrate by way of a re-melted solder material deposit (16). Furthermore, the invention relates to a method for producing a chip arrangement (18).

10 Claims, 2 Drawing Sheets

(51) Int. Cl.
  *B23K 1/00* (2006.01)
  *B23K 1/005* (2006.01)
  *H01L 23/00* (2006.01)
  *B23K 26/14* (2014.01)
  *H01L 23/498* (2006.01)
  *B23K 101/42* (2006.01)

(52) U.S. Cl.
  CPC .... *B23K 26/1462* (2015.10); *H01L 23/49827* (2013.01); *H01L 23/49838* (2013.01); *H01L 24/16* (2013.01); *H01L 24/75* (2013.01); *H01L 24/81* (2013.01); *H01L 25/0652* (2013.01); *H01L 25/0657* (2013.01); *H01L 25/50* (2013.01); *B23K 2201/42* (2013.01); *H01L 2224/13101* (2013.01); *H01L 2224/16057* (2013.01); *H01L 2224/16105* (2013.01); *H01L 2224/16108* (2013.01); *H01L 2224/16225* (2013.01); *H01L 2224/16227* (2013.01); *H01L 2224/75252* (2013.01); *H01L 2224/75263* (2013.01); *H01L 2224/75745* (2013.01); *H01L 2224/81121* (2013.01); *H01L 2224/81192* (2013.01); *H01L 2224/81224* (2013.01); *H01L 2224/81815* (2013.01); *H01L 2224/81986* (2013.01); *H01L 2225/06551* (2013.01); *H01L 2924/181* (2013.01)

(56) References Cited

U.S. PATENT DOCUMENTS

| | | | | |
|---|---|---|---|---|
| 5,327,327 | A * | 7/1994 | Frew | H01L 25/0657 174/255 |
| 5,567,654 | A * | 10/1996 | Beilstein, Jr. | H01L 23/49827 257/E21.705 |
| 5,793,116 | A * | 8/1998 | Rinne | H01L 24/10 257/723 |
| 5,801,448 | A * | 9/1998 | Ball | H01L 25/0657 257/685 |
| 5,828,031 | A * | 10/1998 | Pattanaik | B23K 1/0056 219/121.63 |
| 6,140,696 | A | 10/2000 | Kinsman | |
| 6,784,372 | B1 * | 8/2004 | Yuen | H05K 3/3442 174/250 |
| 8,480,298 | B2 * | 7/2013 | Azdasht | G01R 1/06705 374/141 |
| 8,870,051 | B2 * | 10/2014 | Brofman | B23K 31/02 228/42 |
| 2001/0012638 | A1 | 8/2001 | Kinsman | |
| 2005/0040511 | A1 | 2/2005 | Kinsman | |
| 2009/0032296 | A1 * | 2/2009 | Azdasht | B23K 1/0056 174/260 |

FOREIGN PATENT DOCUMENTS

| | | | |
|---|---|---|---|
| KR | 20110107125 A * | 9/2011 | H01L 24/16 |
| TW | 209313 B | 7/1993 | |
| WO | 2007/056997 | 5/2007 | |

OTHER PUBLICATIONS

Taiwan Patent Office, Office Action and Search Report, Application No. 103102721, Nov. 20, 2015.

The International Search Report as mailed on Jul. 31, 2014 for International Application No. PCT/EP2014/051194.

* cited by examiner

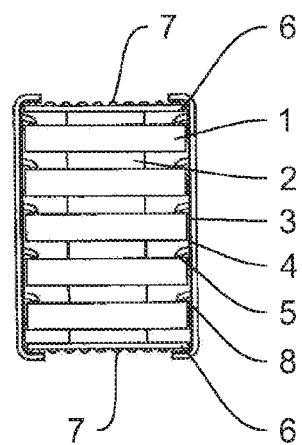
Fig. 1
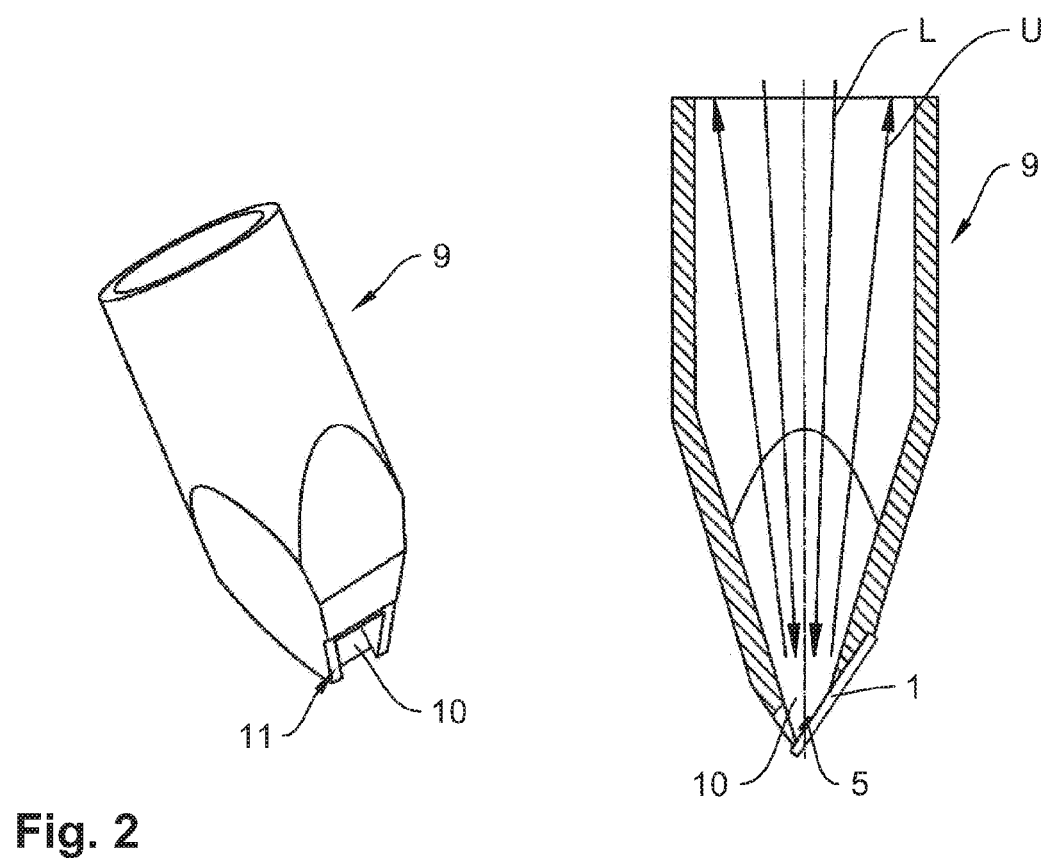
Fig. 2
Fig. 3

SEMICONDUCTOR CHIP ASSEMBLY AND METHOD FOR MANUFACTURING THE SAME

CROSS-REFERENCE TO RELATED APPLICATIONS

This application represents the national stage entry of PCT International Application No. PCT/EP2014/051194 filed Jan. 22, 2014 and claims priority to German Patent Application No. 10 2013 001 642.8 filed Jan. 31, 2013. The contents of this application are hereby incorporated by reference as if set forth in their entirety herein.

The present invention relates to a chip arrangement comprising a terminal substrate and a plurality of semiconductor substrates which are arranged on the terminal substrate, wherein terminal faces arranged on a contact surface of the semiconductor substrates are connected to terminal faces on a contact surface of the terminal substrate.

As the miniaturization of electronic devices increases, so do the demands in regard to the density of integration of the electronic components used therein. This applies in particular to memory components or memory extensions, which are typically composed of a plurality of memory chips which are electrically contacted via a common contact substrate.

From DE 196 26 126 A1, a chip arrangement as schematically illustrated in FIG. 1 is known, which is formed as a stacked arrangement in the manner of a sandwich, comprising an alternating arrangement of chips 1 and intermediately arranged adhesive layers 2 which serve for a mechanical cohesion of the stacked arrangement on the one hand and allow for a defined spacing of the individual chips 1 from one another on the other hand. At the side of the stacked arrangement of chips, contact conductor substrates 3 are provided, which are equipped with individual conductor paths 4 permitting an electric contacting of terminal faces 5 of the chips 1 with terminal substrates 6 which respectively delimit the stacked arrangement at the top and at the bottom and whose terminal contacts 7 serve for the external contacting of the chip arrangement. Solder connections 8 are provided for producing an electric contact between the terminal faces 5 of the chips 1 and the conductor paths 4 of the contact conductor substrates 3.

In view of the complex structure of the chip arrangement illustrated in FIG. 1, it is obvious that the production of the chip arrangement is also correspondingly complex, comprising a plurality of successive method steps, which make it necessary to use different tools for producing the stacked arrangement with the chips 1 being arranged on top of each other and being separated from one another by adhesive layers 2, and for producing the solder connections 8 between the terminal faces 5 of the chips 1 and the conductor paths 4 of the contact conductor substrates 3.

Starting from the state of the art, it is the object of the invention to propose a chip arrangement that can be easily produced, and to propose a method that permits easy production of a chip arrangement.

Said object is attained by a chip arrangement having the features of claim 1 and by a method for producing a chip arrangement having the features of claim 7.

In the chip arrangement according to the invention, the chips extend parallel with a lateral edge and transversally with their contact surface to the contact surface of the terminal substrate, wherein vias are arranged in the terminal substrate, which connect external contacts arranged on an external contact side to the terminal faces formed as internal contacts on the contact surface of the terminal substrate, wherein terminal faces of the semiconductor substrates, which are arranged adjacent to the lateral edge, are connected to the internal contacts of the terminal substrate by way of a re-melted solder material deposit. The chip arrangement according to the invention thus permits a row arrangement of the chips, the chips being connected to the terminal substrate merely at a lateral edge.

Preferably, the internal contacts of the terminal substrate and the terminal faces of the chips are arranged relative to one another in such a manner that they form a spatial corner so that a re-melting of the solder material deposits, which are arranged merely on the internal contacts of the terminal substrate, permits a wetting of the terminal faces of the chips.

It is preferred that the spatial corners formed between the internal contacts and the terminal faces have a corner angle α of between 30° and 150°, wherein a corner angle α of between 60° and 120° and in particular of 90° allows for a particularly compact formation of the chip arrangement.

If the lateral edges of the chips and the contact surface of the terminal substrate are spaced from one another by a filling gap, said filling gap can be filled with a molding material so as to produce a particularly durable mechanical connection between the chips and the terminal substrate.

In the method according to the invention for producing a chip arrangement comprising a terminal substrate and a plurality of semiconductor substrates which are arranged on the terminal substrate, in particular chips, wherein terminal faces arranged on a contact surface of the semiconductor substrates are connected to terminal faces on a contact surface of the terminal substrate, the chips are positioned parallel with a lateral edge and transversally with their contact surface to the contact surface of the terminal substrate in such a manner that terminal faces of the chips, which are arranged adjacent to the lateral edge, are assigned to the terminal faces of the terminal substrate, which form internal contacts and which are connected to external contacts arranged on an external contact side of the terminal substrate by means of vias formed in the terminal substrate, and the internal contacts are subsequently connected to the terminal faces by way of re-melted solder material deposits.

If solder material deposits are arranged on the internal contacts of the terminal substrate so as to produce the connection between the terminal faces of the chip and the internal contacts of the terminal substrate, an application of solder material to the plurality of chips can be omitted. Instead, solder material deposits need only be applied to the internal contacts of the terminal substrate, which, in this context, may moreover be already located in the position suitable for the placement of chips thereon.

If the solder material deposits are arranged on the internal contacts of the terminal substrate before the semiconductor substrates are positioned on the contact surface of the terminal substrate, the application of solder material is not impeded by previously positioned chips.

It is particularly advantageous if the positioning of the chips on the contact surface of the terminal substrate takes place by means of a placement tool in such a manner that the chips are picked up by the placement tool, are oriented in correspondence to the desired position relative to the terminal substrate, and are held in said position.

Preferably, the chips are held in position in such a manner that a filling gap is formed between the lateral edges of the chips and the contact surface of the terminal substrate.

It is particularly preferred if the chips are positioned in such a manner that the internal contacts of the terminal substrate and the terminal faces of the chips are arranged relative to one another in such a manner that a corner angle α is formed between them.

Preferably, the chips are held by means of negative pressure.

If the re-melting of the solder material deposits for producing the connection between the internal contacts of the terminal substrate and the terminal faces of the chips takes place while the chips are being positioned, the positioning and re-melting can be performed in a common method step.

Preferably, the solder material deposits are re-melted by means of laser energy in such a manner that the solder material deposits are impinged with laser radiation passing through the placement tool.

For a particularly easy formation of a row arrangement of the chips, the positioning of the chips on the contact surface of the terminal substrate and the connection of the terminal faces of the chips to the internal contacts of the terminal substrate take place successively in such a manner that, in a placement direction parallel to the contact surface of the terminal substrate, one chip after another is positioned and connected to the terminal substrate.

In the following, the invention is explained in more detail with the aid of the drawings, wherein in particular the method for producing the chip arrangement according to the invention is laid out in detail.

In the drawings:

FIG. 1 shows a chip arrangement according to the state of the art;

FIG. 2 shows an exemplary embodiment of a placement tool that is suitable for the production of a chip arrangement;

FIG. 3 shows a longitudinal sectional view of the placement tool;

Figure 4:
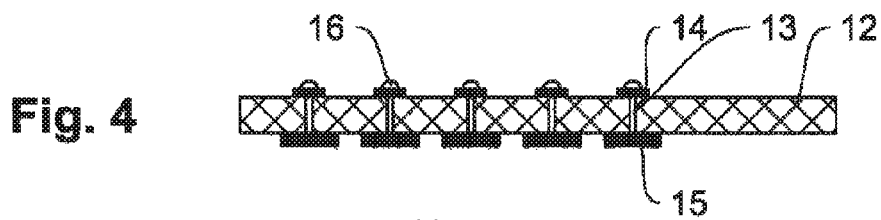
FIG. 4 shows a terminal substrate of a chip arrangement.

In FIGS. 4 to 7, successive method steps for the production of a chip arrangement 18 are illustrated, said chip arrangement 18 being provided with a molding material 17 so as to form a housing, wherein at first a terminal substrate 12 as illustrated in FIG. 4 is provided, which is equipped with vias 13 for producing an electrically conductive connection between internal contacts 14 arranged on a contact surface of the terminal substrate 12 and external contacts 15 arranged on an external contact side of the terminal substrate 12.

Figure 7:
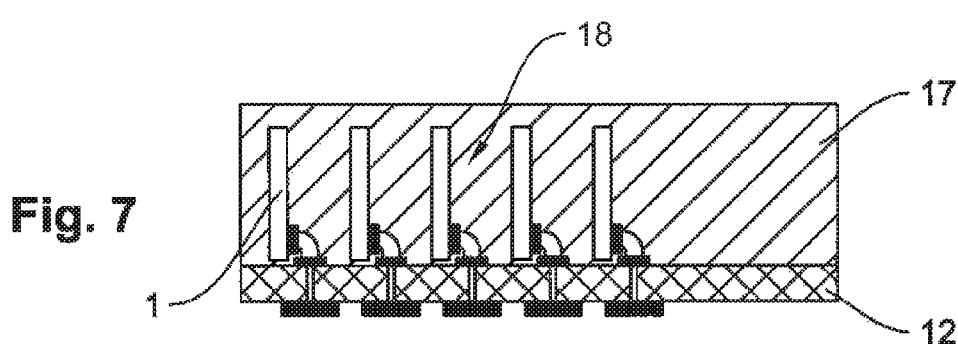
FIG. 7 shows a chip arrangement provided with a molding compound.

In FIGS. 2 and 3, a placement tool 9 as is used for producing the chip arrangement 18 depicted in FIG. 7 is shown in an isometric illustration and in a sectional view. At the end of a conduit, the placement tool 9 has a window opening 10 with a positioning frame 11, which, as shown in FIG. 3, permits the exact positioning of a chip 1 in the window opening 10. The conduit of the placement tool 9 allows for an impingement of the chip 1 accommodated in the positioning frame 11 with negative pressure U as well as for an impingement of the chip 1 with laser radiation L.

The negative pressure U allows the chip 1 to be fixedly held on the positioning frame 11. The impingement of the chip 1 with laser radiation L makes it possible to heat the silicon body of the chip 1, and thus also terminal faces 5 arranged on a contact surface of the chip 1, in a defined manner.

As FIG. 4 shows, the internal contacts 14 of the contact substrate 12 are provided with a solder material deposit 16 so as to prepare for a subsequent contacting with the terminal faces 5 of the chips 1.

Figure 5:
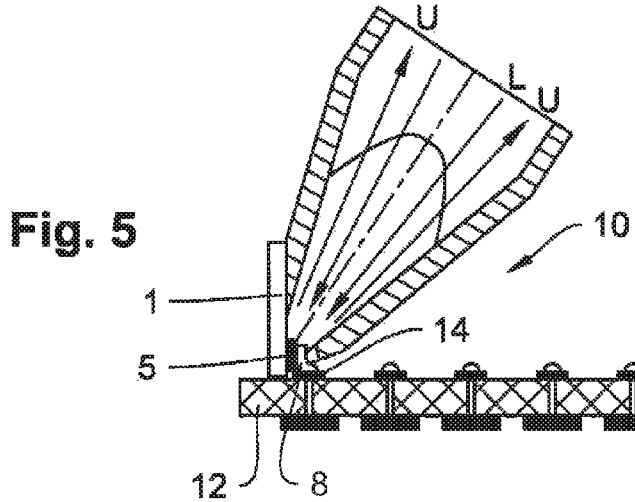
FIG. 5 shows the positioning of a chip on the terminal substrate illustrated in FIG. 4.
Figure 6:
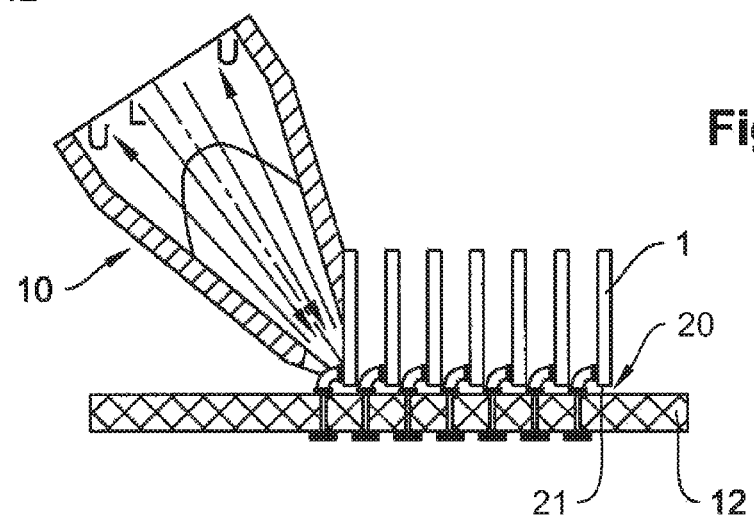
FIG. 6 shows the continuing positioning of chips on the terminal substrate in the placement direction.

As illustrated in FIGS. 5 and 6, starting with a chip 1 arranged at an edge of the terminal substrate 12, individual chips 1 are then successively contacted, wherein each individual chip 1 is picked up by the placement tool 9 by means of negative pressure U and is oriented in correspondence to its desired position relative to the terminal substrate 12 in such a manner that the internal contacts 14 and the terminal faces 5 are arranged relative to one another such that they form spatial corners, wherein, in the present case, a corner angle α of 90° is formed between the internal contacts 14 and the terminal faces 5, respectively. In this relative position, an at least partial re-melting of the solder material deposit 16 takes place by way of an energy source emitting the laser radiation L, so that after a short-term re-melting, a solder connection 8 formed by the solder material deposit 16 quickly solidifies.

Subsequently, as illustrated in FIG. 6, the other chips 1 are continuously positioned one after the other by means of the placement tool 9 and are contacted so as to form a row arrangement of chips 1. In this process, the chips 1 are positioned such that a filling gap 20 is formed between a lateral edge 21 of the chips and the contact surface of the terminal substrate 12, which filling gap is filled with the molding material 17 once the row arrangement of chips 1 has been completed, as shown in FIG. 7.

The placement tool 9 thus allows for both a defined positioning of the chips 1 on the terminal substrate 12 and a re-melting of the solder material deposits 16 for producing the solder connection 8 between the internal contacts 14 of the terminal substrate 12 and the terminal faces 5 of the chips 1. In this way, the arrangement of the chips 1 on the terminal substrate 12 and the production of the electrically conductive connection takes place by a re-melting of the solder material deposits 16 so as to form the solder connections 8 in a common method step instead of being performed successively by means of two different tools, as is the case in the state of the art described with reference to FIG. 1.

As FIG. 6 shows, all chips 1 are successively arranged on the terminal substrate 12 and are connected in an electrically conductive manner to the terminal substrate 12, wherein, following the re-melting of the solder material deposits 16, the chips 1 are held by the placement tool 9 until the solder material has solidified as a solder connection 8, so that no adhesive layers 2 are necessary between the individual chips 1 for fixing the relative arrangement of the chips 1, as is the case in the state of the art illustrated in FIG. 1.

Once the placement of the desired number of chips 1 on the terminal substrate 12 has been completed, a hermetically sealed composite of the chips 1 with the terminal substrate 12 can be produced by means of the molding material 17 which is applied to the terminal substrate 12, as illustrated in FIG. 7.

The invention claimed is:

1. A method for producing a chip arrangement including a terminal substrate and a plurality of semiconductor substrates in the form of chips arranged on the terminal substrate, wherein terminal faces on a contact surface of the chips are connected to internal contacts on an internal contact surface of the terminal substrate, said method comprising:

using a placement tool with a window opening to pick up a contact surface side of each of the plurality of chips such that the chips are inclined with respect to a longitudinal axis of the placement tool;

positioning the chips parallel to one another with a lateral chip edge parallel to the contact surface of the terminal substrate with the placement tool oriented in such a manner that terminal faces arranged on the chip adjacent to the lateral edge of the chip correspond to internal contacts on the internal contact surface of the terminal substrate, and holding the chip in position in such a manner that a filling gap is formed between the lateral edges of the chips and the contact surface of the terminal substrate, said filling gap adapted to be filled with a molding material;

said internal contacts being connected to external contacts arranged on an external contact side of the terminal substrate by vias formed in the terminal substrate; and subsequently connecting the internal contacts to the terminal faces using re-melted solder material deposits, wherein the re-melting and solidifying of the solder material deposits that produces a solder connection between the internal contacts of the terminal substrate and the corresponding terminal faces of the chip takes place while the chips are being positioned and held by the placement tool.

2. The method according to claim 1, in which prior to connecting the terminal faces of the chips and the internal contacts of the terminal substrate, the solder material deposits are arranged on the internal contacts of the terminal substrate.

3. The method according to claim 2, in which the arrangement of the solder material deposits on the internal contacts of the terminal substrate takes place before the chips are positioned on the contact surface of the terminal substrate.

4. The method according to claim 1, in which the chips are held in position in such a manner that a filling gap is formed between the lateral edges of the chips and the contact surface of the terminal substrate.

5. The method according to claim 1,
in which the positioning of the chips takes place in such a manner that the internal contacts of the terminal substrate and the terminal faces of the chips are arranged relative to one another in such a manner that a corner angle $\alpha$ is formed between them.

6. The method according to claim 1, in which the chips are held by negative pressure.

7. The method according to claim 1,
in which the re-melting of the solder material deposits for producing a solder connection between the internal contacts of the terminal substrate and the terminal faces of the chip takes place while the chips are being positioned.

8. The method according to claim 1,
in which the solder material deposits are re-melted by laser energy.

9. The method according to claim 8, in which the solder material deposits are impinged with laser radiation passing through the placement tool.

10. The method according to claim 1, in which the positioning of the chips on the contact surface of the terminal substrate and the connection of the terminal faces of the chips to the internal contacts of the terminal substrate take place successively in such a manner that, in a placement direction parallel to the contact surface of the terminal substrate, one chip after another is positioned and connected to the terminal substrate.

* * * * *